United States Patent [19]

Min et al.

[11] Patent Number: 5,135,726
[45] Date of Patent: Aug. 4, 1992

[54] VERTICAL GRADIENT FREEZING APPARATUS FOR COMPOUND SEMICONDUCTOR SINGLE CRYSTAL GROWTH

[75] Inventors: Suk Ki Min; Seung Chul Park; Chul Won Han; Young Ju Park; Kwang Bo Shim, all of Seoul, Rep. of Korea

[73] Assignee: Korea Institute of Science and Technology, Seoul, Rep. of Korea

[21] Appl. No.: 672,563

[22] Filed: Mar. 20, 1991

[30] Foreign Application Priority Data

Apr. 4, 1990 [KR] Rep. of Korea .................. 4653/1990

[51] Int. Cl.$^5$ ............................................. B01D 9/00
[52] U.S. Cl. ................................ 422/248; 156/616.1; 156/616.2; 156/616.3; 156/616.4; 156/616.41; 156/DIG. 70; 164/122.2; 373/137; 373/139; 422/245
[58] Field of Search ............... 156/616.1, 616.2, 616.3, 156/616.4, 616.41, DIG. 70; 164/122.2; 422/245, 248; 373/137, 139

[56] References Cited

U.S. PATENT DOCUMENTS

| | | | |
|---|---|---|---|
| 4,242,175 | 12/1980 | Zumbrunnen | 156/616.41 |
| 4,863,553 | 9/1989 | Lehoczky et al. | 156/616.4 |
| 4,904,336 | 2/1990 | Ozawa et al. | 422/248 |
| 4,957,711 | 9/1990 | Min et al. | 156/616.1 |

FOREIGN PATENT DOCUMENTS

2090545 7/1982 United Kingdom ........... 156/616.41

OTHER PUBLICATIONS

"Low Cost Conversion of Polycrystalline Silicon Into Sheet by Hem and Fast;" Khatlak et al; Conference: 14th IEEE Photovoltaic Specialists Conf. 1980; San Diego CA USA (Jan. 7-10, 1980), pp. 484-488.

"Infrared Heating for People and Products", GE Lamp Division, 1974, pp. 1-23.

Primary Examiner—Robert Kunemund
Assistant Examiner—Felisa Garrett
Attorney, Agent, or Firm—Darby & Darby

[57] ABSTRACT

A vertical gradient freeze single crystal growing apparatus utilizing a direct monitoring furnace which is possible to obtain rapid high temperature heating and uniform temperature distribution by using direct monitoring furnace as a higher temperature part furnace provided with double quartz tube applied with gold thin film, and also capable of observing entire process of single crystal growing directly by naked eye.

The apparatus includes a direct monitoring furnace corresponding to higher temperature part furnace and lower temperature part furnace mounted on vertically standing guide rails so as to be moved upwardly and downwardly voluntarily thereon simultaneously or independently, and the direct monitoring furnace is provided with heater wires divided into more than two regions to inner side of protecting quartz tube provided within double quartz tube applied with gold thin film on its interior surface and formed with cooling water in and outlets and also crystal growing reaction tube capable of normal and reverse turning is provided thereto, and a number of thermocouples are provided to the furnaces.

14 Claims, 3 Drawing Sheets

VERTICAL GRADIENT FREEZING APPARATUS FOR COMPOUND SEMICONDUCTOR SINGLE CRYSTAL GROWTH

BACKGROUND OF THE INVENTION

The present invention relates to a single crystal growing apparatus for compound semiconductor material of III-V, II-VI groups including gallium arsenide (GaAs), and more particularly to a single crystal growing apparatus of vertical gradient freezing method for compound semiconductor which is capable of obtaining rapid high temperature heating and uniform temperature distribution by utilizing a direct monitoring furnace as a higher temperature part furnace having double quartz tube applied with gold film in growing single crystal by utilizing vertical temperature gradient freeze method, and also capable of observing entire processes of single crystal growing directly with the naked eye.

Presently, horizontal Bridgman method and liquid encapsulated Czochralski method are widely known for typical two manufacturing methods which are being practically used in manufacturing gallium arsenide (GaAs) as a single crystal growing method which is being used generally.

Horizontal Bridgman single crystal growing method is a form in which liquid phase gallium and solid phase arsenic are respectively placed into the interior of quartz reaction tube provided with higher temperature part and lower temperature part and then, in a state that they are heated at high temperature and gallium arsenide (GaAs) is synthesized whereby molten gallium arsenide is obtained, while growing furnace around said quartz reaction tube is horizontally moved, then single crystal is grown. The wafer manufactured by such a single crystal growing method has advantage of maintaining high grade being less in dislocation density according to the lower temperature gradient, but on the contrary, cross section of the wafer is semicircle which is not a circle and its diameter is smaller, and therefore there has been disadvantage that manufacturing of the wafer having larger diameter more than 2 inches is difficult.

On the other hand, the wafer manufactured by liquid encapsulated Czochralski method is circular form in its cross section and having a relatively larger diameter more than 3 inches in its magnitude, on the contrary, since excessive thermal stress causing from high temperature gradient of axial or radial direction of solid-liquid interface is applied in the time of crystal growing, there has been a problem that larger dislocation density ($10^4$-$10^5$cm$^{-2}$) is produced relative to the wafer manufactured through the horizontal Bridgman method.

Vertical gradient freeze method has been proposed as a single crystal growing method of new form developed by considering various problems encountered in such horizontal Bridgman method and liquid encapsulated Czochralski method.

Basic principle of the single crystal growing by this vertical gradient freeze method relates to a method that firstly gallium arsenide polycrystalline of high purity which is previously synthesized is filled into the interior of PBN (pyrolytic boron nitride) reaction container or quartz reaction container whereby it is fixed to the interior of a higher temperature part furnace and simultaneously arsenic for maintaining the interior of reaction tube to one atmospheric pressure is placed to a lower temperature part and thereafter temperature gradient of higher part is changed and thereby said polycrystalline is slowly solidified so as the solid-liquid interface is gradually moved to upward portion from starting point of seed crystal located at the bottom end portion of reaction container containing molten gallium arsenide by changing the temperature gradient of the higher temperature part so that single crystal is grown. After this method is tried for the growing of phosphide (GaP) single crystal firstly by S. E. Blum et al in 1973 [Refer to: S. E. Blum and R. J. Chicotka, J. Electrochem, Soc. 120(1973) 588], many researches have been carried out for this method.

As a single crystal growing apparatus of compound semiconductor of III-V group, II-IV group utilizing such a vertical gradient freeze method, a single crystal growing apparatus of semiconductor compound capable of manufacturing circular gallium arsenide wafer of larger diameter while exhibiting relatively lower dislocation density of semi-insulation property is described in U.S. Pat. No. 4,404,172.

However, the apparatus utilizing existing vertical gradient freeze method including aforementioned U.S. Pat. No. 4,404,172 use almost high pressure container, accordingly structure is complicated, and since not only difficulty is involved in manufacturing but also heat capacity of higher temperature part furnace is larger, sensitive temperature gradient can not be given in the time of single crystal growing, and in case that heating element is graphite heater, the temperature distribution around reaction tube is determined in accordance with the shape of said heater, so that it is not easy to find out while controlling voluntarily optimum crystal growing condition, and since the temperature control is executed on the basis of temperature measured by mounting a number of thermocouples, there is problem that single crystal growing process within the interior of furnace upon crystal growing can not be observed practically, and therefore there is disadvantage accompanying with difficulty for the crystal growing having reproducibility.

SUMMARY OF THE INVENTION

Therefore, it is an object of the present invention to provide a single crystal growing apparatus by vertical gradient freeze method in which direct monitoring furnace structured with double quartz tube to be transparent is mounted at higher temperature part and thereby not only entire processes of crystal growing can be observed by the naked eye but also change of sensitive temperature gradient can be applied upon crystal growing, and also rapid heating is possible whereby it is suitable for the gallium arsenide single crystal growing of less defect and larger diameter.

To accomplish the above object, according to the present invention, direct monitoring furnace is mounted to the higher temperature part in which gold thin film is formed to the interior wall of double quartz tube that circulation of cooling water is possible into the interior, and cylindrical protecting quartz tube is inserted between heating wire and double quartz tube so as to absorb primarily infrared ray emitted from heating wire of inner side.

Particularly, the direct monitoring furnace of the present invention has special feature that since the heat capacity is less, heating and cooling within short period of time are possible whereby change of sensitive temperature gradient can be applied upon crystal growing, and accordingly it is a furnace suitable for single crystal growing by temperature gradient freeze method, wherein while separate auxiliary installation for the observation of crystal growing process is not required, entire processes of crystal growing can be observed by the naked eye.

On the other hand, the single crystal growing apparatus of the present invention is to be suitable for the vertical gradient freeze method by improving "horizontal Bridgman single crystal growing apparatus utilizing direct monitoring furnace" (U.S. Pat. No. 4,957,711) filed by inventors of this application.

DETAILED DESCRIPTION OF THE INVENTION

The present invention will be described in detail with reference to the accompanying drawings.

Figure 1:
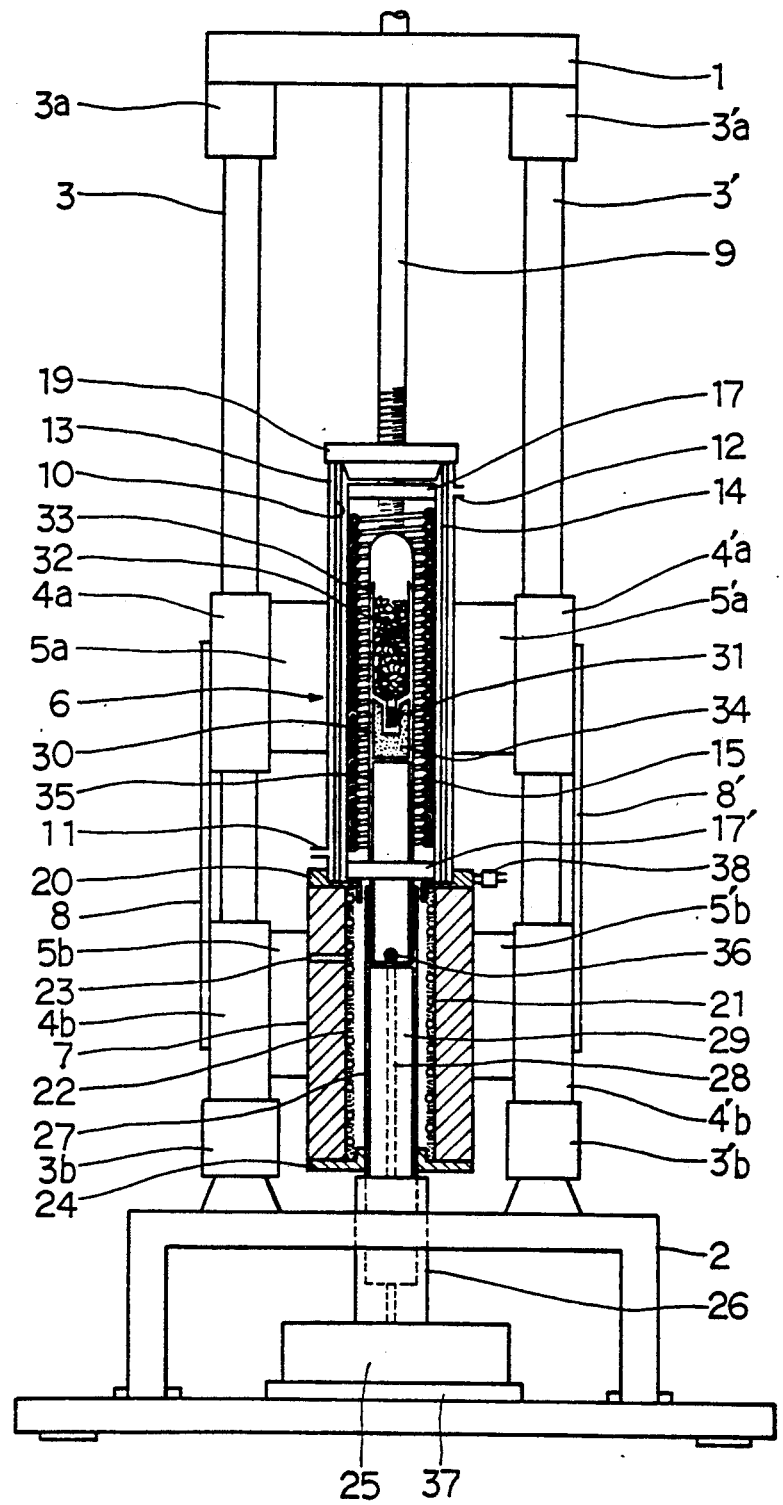
FIG. 1 is a front elevational view showing the configuration of the apparatus according to the present invention.

FIG. 1 is a front elevational view showing the configuration of the single crystal growing apparatus of the present invention, as shown in the drawing, two bar guide rails 3, 3' are vertically fixed in parallel between upper supporting frame 1 and bottom supporting frame 2 and bottom surface of top supporting frame 1, and cylindrical upper sliders 4a4'a and lower sliders 4b, 4'b which are guided on the guide rails 3, 3' so as to be vertically movable and their moving range is defined by top stoppers 3a, 3'a and bottom stoppers 3b, 3'b, are inserted to external circumferential surface of said guide rails 3, 3', and said upper and lower sliders 4a, 4'a, 4b, 4'b are fixed to the external circumferential surfaces of direct monitoring furnace 6, which is higher temperature part furnace, and lower temperature part furnace 7 respectively by upper connecting plates 5a, 5'a and lower connecting plates 5b, 5'b.

And, the upper sliders 4a, 4'a and lower sliders 4'b, 4'b are connected together by connectors 8, 8', and lifting and dropping movements of these upper and lower sliders 4a, 4'a, 4b, 4'b are carried out by the driving of driving screw 9 located at rear side of the furnaces 6, 7, wherein the direct monitoring furnace 6 and the lower temperature part furnace 7 are constituted so as to be moved simultaneously or independently according to the presence or absence of mutual connection of said connectors 8, 8', and a weight (not shown) is provided in order to minimize a load applied to the driving screw 9 of the furnaces 6, 7.

Figure 2:
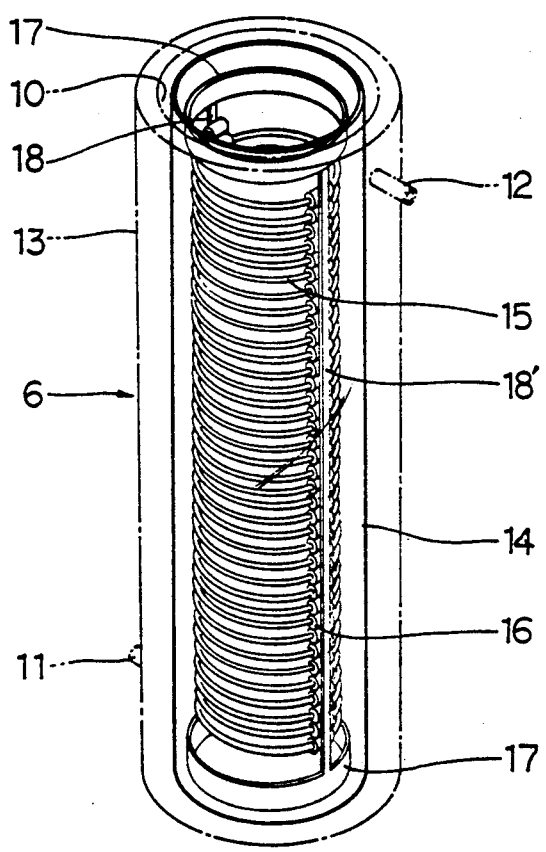
FIG. 2 is a fragmentary magnified view showing the direct monitoring furnace of FIG. 1.

On the other hand, the direct monitoring furnace 6 is most important section of the present invention, so when viewing its detailed structure by FIG. 2, gold thin film 10 applied with gold solution is formed to internal wall surface and cooling water inlet 11 is provided at a side of lower part of external wall surface and cooling water outlet 12 is provided at a side of upper part thereof whereby double quartz tube 13 enabling the circulation of cooling water within the interior is formed, and a cylindrical protecting quartz tube 14 is placed at inner side of this double quartz tube 13 in order to prevent direct heating of gold thin film 10 by absorbing primarily infrared ray from heating wire, and besides, spiral heating wire 15 made of kanthal or platinum wire divided into three temperature regions is mounted at inner side of this protecting quartz tube 14.

At this moment, in order to prevent mutual contact between adjoining heating wires, spacers 16 made of alumina material having predetermined thickness are inserted to both sides around the heating wires 15 whereby supporting the heating wires 15, while in order to maintain original form of the heating wires 15 in the time of high temperature heating, upper and lower ceramic supporters 17, 17' made of ceramic material of annular ring shape are fixed to the ceramic supporting tubes 18, 18' by ceramic bond with the spacers 16, and temperature control thermocouples (not shown in drawing) are attached to each region of three temperature regions whereby different temperature gradients each other are given so that temperature gradient freezing can be carried out.

According to the direct monitoring furnace 6 having such structure, as shown in FIG. 1, ceramic insulation material 19 of disc shape is mounted at the top end portion to thereby be structured so as to prevent heat loss and to maintain thermal equilibrium of interior of the furnace, and another ceramic insulation material 20 of annular ring shape is mounted to the portion contacting with the top end portion of lower temperature part furnace 7 of its bottom end portion.

Next, the lower temperature part furnace 7 located at the bottom end portion of the direct monitoring furnace 6 is formed with heating wire 21 made of nichrome wire divided into three regions within the interior through entire length of upper and lower parts with interposing insulation material 22 between them, and thermocouple inserting holes 23 for inserting temperature control thermocouple to be mounted for precise temperature control are provided at each region, and ceramic insulation material 24 of disc shape is provided at its bottom end portion.

On the other hand, reaction tube supporting frame 27 of cylindrical shape coupled on turning device 26 driven by DC motor 25 mounted at central portion of bottom supporting frame 2 is vertically fixed at cylindrical space of inner side of the lower temperature part furnace 7, and reaction tube supporter 29 made of fireproof material provided with vertically pierced thermocouple hole 28 is inserted and fixed at central portion of interior of the reaction tube supporter 27.

And, crystal growing reaction tube 30 vertically mounted toward inner space portion of the direct monitoring furnace 6 is inserted and mounted, so as to enable normal and reverse rotation, above the top end portion of inner side reaction tube supporter 29 of said reaction tube supporting frame 27, and reaction container 33 in which seed crystal 31 is placed at bottom portion and gallium arsenide polycrystalline 32 is filled within interior, reaction container supporter 34 for supporting said reaction container 33, as well as quartz plug 35 for vertically supporting these reaction container 33 and reaction container supporter 34, are inserted into inner side of said crystal growing reaction tube 30.

Further, arsenic 36 is placed at bottom surface portion of the crystal growing reaction tube 30 located above the plane surface portion of top end of the reaction tube supporter 29 having the thermocouple holes 28 at central portion thereof in order to maintain the interior to be one atmospheric pressure.

On the other hand, position of DC motor 25 is possible to change through control of motor fixing base 37 of its bottom end portion, and electric power supply to be applied to the crystal growing apparatus is made to be supplied through electric power supply feeding cord 38 provided at a side of top end of the lower temperature part furnace 7, and the reaction container supporter 34 located at the bottom of the reaction container 33 is used with article manufactured by either high temperature molded boron nitride or processing of high purity degree graphite or silicon single crystal.

The process for growing compound semiconductor single crystal by utilizing an apparatus of the present invention constructed as above will be described in detail as follows.

Firstly, arsenic 36 is placed on the bottom surface of the crystal growing reaction tube 30 and simultaneously seed crystal 31 is accommodated at bottom end portion of the reaction container 33 and the gallium arsenide polycrystalline 32 is filled to its upper portion and then electric power is applied through the electric power supply cord 38 in a state that interior of the crystal growing reaction tube 30 is maintained by vacuum of $10^{-6}$ Torr whereby the direct monitoring furnace 6 and the lower temperature part furnace 7 are actuated and thereby heating is executed.

At this moment, the turning device 26 provided at bottom portion is driven whereby the crystal growing reaction tube 30 coupled with said turning device 26 is driven in normal or reverse rotation, so that thermal unbalance in radial direction of the furnaces 6, 7 is minimized and simultaneously temperatures within the interior of the furnaces 6, 7 are checked through a number of thermocouples provided on the furnaces 6, 7 and thereby predetermined temperature gradient is obtained.

Figure 3:
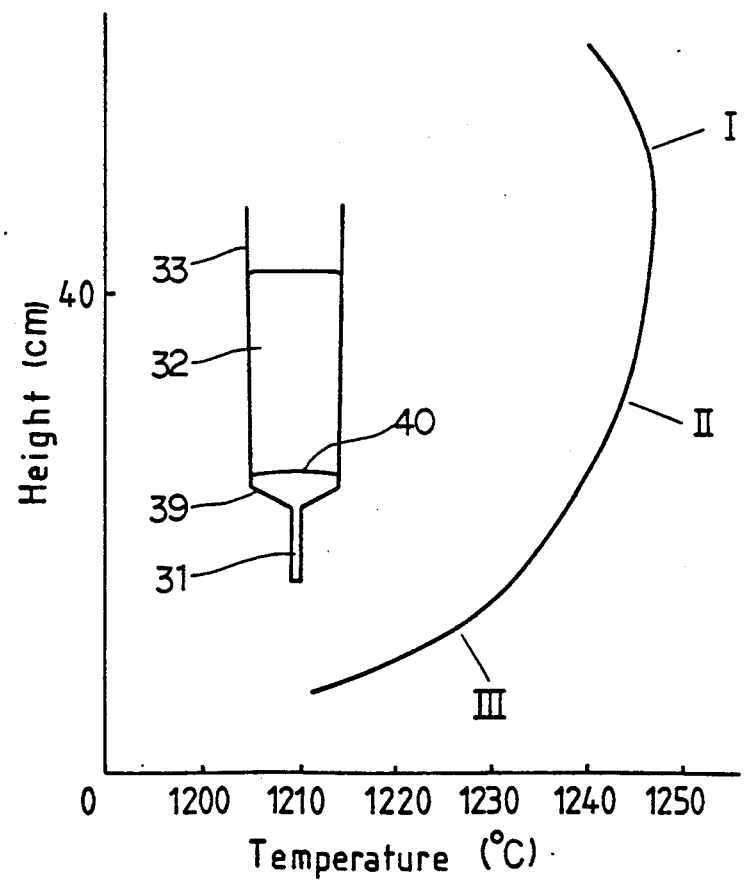
FIG. 3 is a graph illustrating typical temperature distribution of vertical gradient freeze single crystal growing apparatus according to the present invention.

FIG. 3 is a graph illustrating typical temperature gradient required at a time when gallium arsenide single crystal is grown by the apparatus of the present invention, as illustrated here, melting point of the gallium arsenide 32 filled into the reaction container 33 is made to be distributed at the top end portion of location placed with the seed crystal 31 and then liquid phase gallium arsenide 32 contacts with the top end portion of the seed crystal 31 whereby the single crystal growing is proceeded, at this moment, while the temperature gradient is rather less from tapered portion 39 toward its upper portion of the reaction container 33, portion which may be reached the lower end portion of the seed crystal 31 of its down side is maintained with rather larger temperature gradient, so that the crystal growing is smoothly carried out.

Particularly, the temperature gradient of the portion that solid-liquid interface 40 is formed whereby single crystal growing is proceeded should be maintained so as to be almost constant by combining appropriately the temperature distribution of each of the regions I, II, III.

As described above, according to the present invention, not only uniform temperature distribution can be obtained at over 1240° C. according to the heat concentrating force of high temperature portion obtained by the direct monitoring furnace provided with double quartz tube applied with gold thin film at interior wall surface thereof but also form of solid-liquid interface and entire process of crystal growing can be directly observed with the naked eye or through a camera tube such as charge coupled device (CCD), and therefore it can be utilized with reproducibility in manufacturing bulk single crystal of compound semiconductor material of III - V group and II - VI group including gallium arsenide (GaAs) as well as in synthesizing the polycrystalline.

And, according to the present invention, since vertical lifting and dropping movement of the furnace is possible, correct position control of solid-liquid interface is possible upon crystal growing, and high temperature heating over 1240° C. and cooling in short period of time and precise temperature control are possible, and therefore there is advantage that optimum condition is provided to the temperature gradient freeze method and simultaneously it can also be utilized for the vertical Bridgman single crystal growing.

What is claimed is:

1. A high temperature vertical gradient freeze single crystal growing apparatus, comprising:
    a quartz reaction tube encompassing a reaction vessel suitable for containing a polycrystalline semiconductor comprising a group III-V compound or a group II-IV compound,
    a member for supporting said reaction vessel at the lower portion thereof, and a quartz plug for supporting said member and for sealing said quartz reaction tube, allowing a vacuum to be maintained within said reaction tube,
    a high temperature, direct monitoring electric furnace surrounded by a cylindrical protective quartz tube, said cylindrical quartz tube being surrounded by a double quartz tube having an outlet and an inlet for cooling water located in the outer wall of said double quartz tube, said double quartz tube having a thin gold film at its inner wall surface, and said double quartz tube being capable of being filled with water and thereby providing a water jacket,
    a spiral heating wire having three heat zones disposed within said protective quartz tube, and spacers inserted between said heating wire and an adjacent segment of said heating wire;
    a low temperature electric furnace into which a lower end of said quartz reaction tube may be inserted;
    upper and lower slider mounts integrally attached to said high temperature electric furnace and low temperature electric furnace and slidably mounted on a pair of guide rails; and
    a rotating device provided with a reaction tube supporting frame at the lower portion of the low temperature electric furnace.

2. The apparatus as defined in claim 1, wherein an annular ring-type heat-insulating member is disposed between a lower portion of the high temperature electric furnace and an upper portion of the high temperature electric furnace for supporting the protective quartz tube inserted in the high temperature electric furnace and the heating wire.

3. The apparatus as defined in claim 1, wherein connectors are releasably mounted between the upper slider mounts and the lower sliders, so that up and down vertical movement of the direct monitoring furnace and the lower temperature furnace can be carried out independently or simultaneously in accordance with the releasing and connecting of the connectors, respectively.

4. The apparatus as defined in claim 1, wherein said high temperature electric furnace has rapid temperature response characteristics and said thin gold film has a predetermined thickness in order to reflect infrared rays and to allow visible rays to pass therethrough so that the interior of the electric furnace can be observed with an naked eye or a charge-coupled device.

5. The apparatus as defined in claim 1, wherein said high temperature electric furnace can achieve, through a heat concentration, a temperature ranging over 1240° C., said high temperature achieved without having a thick surrounding heat-insulating layer.

6. The apparatus as defined in claim 5, wherein said heating wire divided into three heat regions has a gap between the regions so as to obtain a temperature gradient within the high temperature electric furnace.

7. The apparatus as defined in claim 4, wherein said heating wire within the high temperature electric furnace is a canthal wire or a platinum wire.

8. A high temperature vertical gradient freeze single crystal growing apparatus comprising:
    a direct monitoring electric furnace having a lower and an upper portion, said furnace comprising:
        a spiral heating wire having three heat zones, said heating wire disposed to create an interior space suitable for a reaction tube;
        a cylindrical protective quartz tube disposed about said wire;
        a double quartz tube disposed about said protective tube, said double quartz tube having an outlet and an inlet for cooling water located in the outer wall and being capable of being filled with water and thereby providing a water jacket; and
        a thin gold film lining the inner surface of said double quartz tube.

9. The apparatus as defined in claim 8, wherein an annular ring-type heat-insulating member is disposed between the lower portion of the electric furnace and the upper portion of the electric furnace for supporting the protective quartz tube.

10. The apparatus according to claim 9 wherein said furnace comprises a high temperature furnace.

11. The apparatus as defined in claim 8, wherein said high temperature electric furnace has rapid temperature response characteristics; said thin gold film has a predetermined thickness, reflects infrared rays and allows visible rays to pass therethrough; and the interior of the electric furnace can be observed with an naked eye or a charge-coupled device.

12. The apparatus as defined in claim 11, wherein said heating wire within the high temperature electric furnace comprises canthal or platinum.

13. The apparatus as defined in claim 8, wherein said electric furnace can achieve a temperature ranging over 1240° C. without having a thick surrounding heat-insulating layer.

14. The apparatus as defined in claim 13, wherein each of said three heating wire zones is spaced apart from each other.

* * * * *